United States Patent
Liang et al.

(10) Patent No.: US 10,943,650 B2
(45) Date of Patent: Mar. 9, 2021

(54) METHOD FOR PROGRAMMING MEMORY SYSTEM

(71) Applicant: Yangtze Memory Technologies Co., Ltd., Wuhan (CN)

(72) Inventors: Ke Liang, Wuhan (CN); Chun Yuan Hou, Wuhan (CN); Qiang Tang, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 98 days.

(21) Appl. No.: 16/409,855

(22) Filed: May 12, 2019

(65) Prior Publication Data

US 2020/0234759 A1 Jul. 23, 2020

Related U.S. Application Data

(63) Continuation of application No. PCT/CN2019/072859, filed on Jan. 23, 2019.

(51) Int. Cl.
G11C 7/00 (2006.01)
G11C 11/56 (2006.01)
G11C 16/10 (2006.01)
G11C 16/08 (2006.01)
(Continued)

(52) U.S. Cl.
CPC .......... G11C 11/5628 (2013.01); G11C 16/08 (2013.01); G11C 16/10 (2013.01); G11C 16/3459 (2013.01); *G11C 16/0483* (2013.01)

(58) Field of Classification Search
CPC ..... G11C 16/0483; G11C 16/10; G11C 16/26; G11C 16/12; G11C 16/32; G11C 16/08; G11C 7/222; G11C 16/14; G11C 7/106; G11C 16/24; G11C 16/30; G11C 16/28; G11C 5/145; G11C 7/1057; G11C 7/1066
See application file for complete search history.

(56) References Cited

U.S. PATENT DOCUMENTS

| 6,888,758 B1 | 5/2005 | Hemink |
| 7,177,199 B2 | 2/2007 | Chen |
| 7,324,383 B2 | 1/2008 | Incarnati |

(Continued)

FOREIGN PATENT DOCUMENTS

| CN | 1879175 A | 12/2006 |
| CN | 1926637 A | 3/2007 |

(Continued)

*Primary Examiner* — Hien N Nguyen
(74) *Attorney, Agent, or Firm* — Winston Hsu

(57) ABSTRACT

A memory system comprising a plurality of memory cells each including a storage element having a first terminal and a control terminal. The method for operating the memory system includes applying a first program voltage to control terminals of storage elements and applying a basic reference voltage to first terminals of the storage elements during a first program operation, performing a group verification by comparing threshold voltages of the storage elements with a middle voltage, performing a first program test to check if the threshold voltages of the storage elements are greater than a first programming threshold voltage, and performing a second program operation according to a result of the group verification and a result of the first program test. The middle voltage is smaller than the first programming threshold voltage.

24 Claims, 5 Drawing Sheets

(51) Int. Cl.
    *G11C 16/34*     (2006.01)
    *G11C 16/04*     (2006.01)

(56) References Cited

U.S. PATENT DOCUMENTS

| | | |
|---|---|---|
| 8,310,870 B2 | 11/2012 | Dutta |
| 8,670,279 B2 | 3/2014 | Yoon |
| 9,082,503 B2 | 7/2015 | Kim |
| 9,842,657 B1 | 12/2017 | Dutta |
| 2005/0157552 A1 | 7/2005 | Hemink |
| 2009/0129168 A1 | 5/2009 | Kim |
| 2009/0268516 A1* | 10/2009 | Murin ................ G11C 11/5628 365/185.03 |
| 2011/0280082 A1* | 11/2011 | Ruby ................ G11C 11/5628 365/185.19 |
| 2015/0200019 A1* | 7/2015 | Chin ................ G11C 16/3445 365/185.17 |
| 2016/0314844 A1 | 10/2016 | Dutta |

FOREIGN PATENT DOCUMENTS

| | | |
|---|---|---|
| CN | 101199025 A | 6/2008 |
| CN | 103069494 A | 4/2013 |
| CN | 103489479 A | 1/2014 |
| CN | 106067323 A | 11/2016 |
| KR | 10-20120119533 A | 10/2012 |

* cited by examiner

METHOD FOR PROGRAMMING MEMORY SYSTEM

CROSS REFERENCE TO RELATED APPLICATIONS

This application is a continuation of PCT Application No. PCT/CN2019/072859 filed on Jan. 23, 2019, the entire contents of which are incorporated herein by reference.

BACKGROUND OF THE INVENTION

1. Field of the Invention

The present invention is related to a method for programming a memory system, and more particularly, to a method for programming a memory system with multiple-level cells.

2. Description of the Prior Art

When programming the solid-state drive (SSD) memory cell, especially for multiple-level cells of the NAND flash, the incremental step pulse programming is often adopted. The incremental step pulse programming can inject electrons to the charge storing elements, such as an electronic trapping layer or a storage element, with incremental voltage pulses. If the memory cell is programmed successfully, the threshold voltage of the memory cell will be raised to be higher than a predetermined value. However, if the memory has not been programmed completely, the threshold voltage of the memory cell will still be lower than the predetermined value, and the memory cell will be programmed again with an incremented voltage pulse.

Due to the uncontrollable variation caused during a manufacturing process, some of the memory cells are easier to be programmed while some of the memory cells are more difficult to be programmed and require more times of program operations. Consequently, the memory cells that are more difficult to be programmed will become the bottle neck of the overall program process and will slow down the overall program process.

SUMMARY OF THE INVENTION

One embodiment of the present invention discloses a method for programming a memory system. The memory system includes a plurality of memory cells, and each of the memory cells includes a storage element having a first terminal and a control terminal.

The method includes applying a first program voltage to control terminals of storage elements of the plurality of memory cells and applying a basic reference voltage to first terminals of the storage elements of the plurality of memory cells during a first program operation of the plurality of memory cells, performing a group verification by comparing threshold voltages of the storage elements with a middle voltage, performing a first program test to check if the threshold voltages of the storage elements are greater than a first programming threshold voltage, and performing a second program operation according to a result of the group verification and a result of the first program test. The middle voltage is smaller than the first programming threshold voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
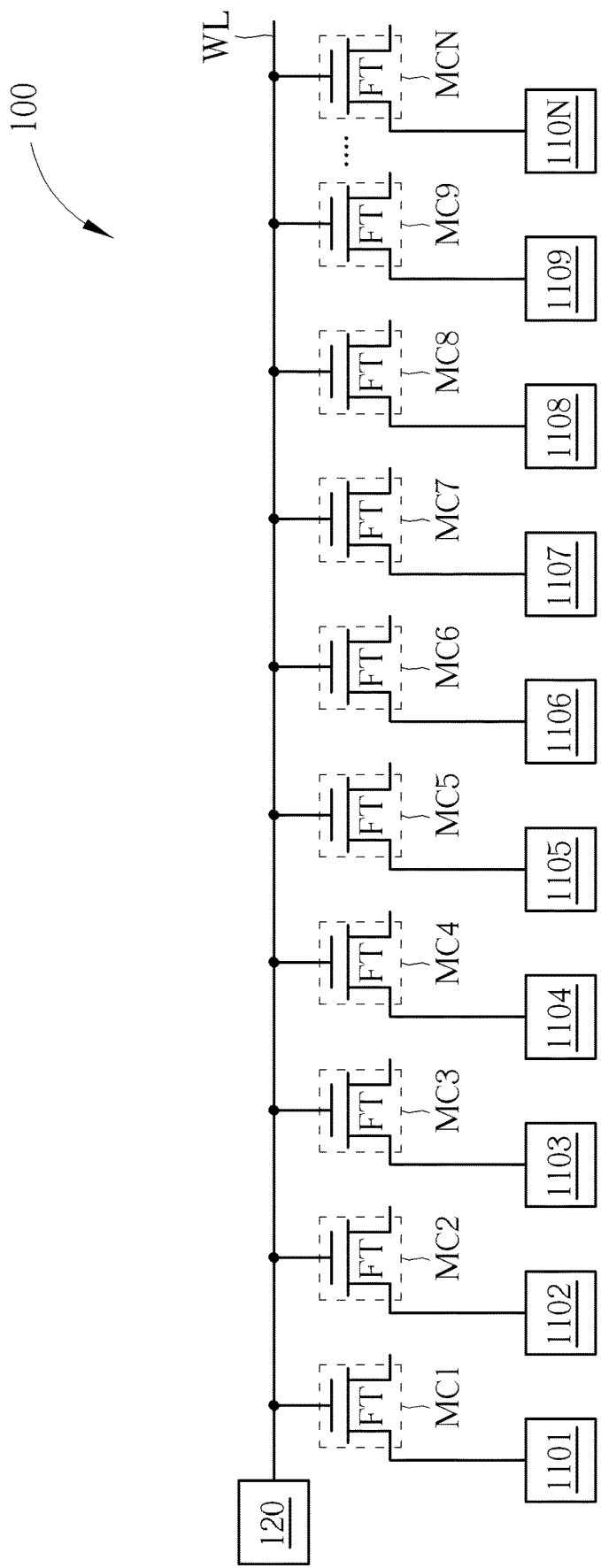
FIG. 1 shows a memory system according to one embodiment of the present invention.

FIG. 1 shows a memory system 100 according to one embodiment of the present invention. The memory system 100 includes a plurality of memory cells MC1 to MCN. In some embodiments, the memory system 100 can be a NAND type flash memory, and the memory cells MC1 to MCN can be multiple-level cells (MLC) including quad-level cells (QLC) and triple-level cells (TLC). That is, each of the memory cells MC1 to MCN can store data of multiple bit states.

In FIG. 1, the memory cells MC1 to MCN can be coupled to the same word line WL, and can be operated simultaneously as a page. Although FIG. 1 shows only one page of memory cells for making a brief explanation, the memory system 100 may further include more pages of memory cells in some other embodiments. The memory cells MC1 to MCN can have the same structure and can be operated with the same principles. For example, the memory cell MC1 can include a storage element FT. The storage element FT can be a floating gate transistor or an electron capturing unit adopted by the flash memory. In FIG. 1, the storage element FT can have a first terminal and a control terminal.

The first terminal of the storage element FT can be a source terminal or a drain terminal of the storage element FT, and the control terminal of the storage element FT can be a floating gate or an electron capturing structure of the storage element FT. In some embodiments, the second terminal of the storage element FT can be floating or coupled to the first terminal of the storage element FT.

During a program operation of the memory cell MC1, the control terminal of the storage element FT of the memory cell MC1 can receive a program voltage, and the first terminal of the storage element FT of the memory cell MC1 can receive a basic reference voltage. In this case, the channel under the control terminal of the storage element FT will be coupled to the basic reference voltage through the first terminal of the storage element FT, and the high cross voltage between the control terminal and the channel of the storage element FT of the memory cell MC1 will cause electron injection to the gate structure of the storage element FT, increasing the threshold voltage of the storage element FT.

By injecting sufficient electrons to the gate structure of the storage element FT, the threshold voltage of the storage element FT will be raised to a desired level. Consequently, the state of data stored in the memory cell MC1 can be identified according to the level of the threshold voltage of the storage element FT of the memory cell MC1.

Figure 2:
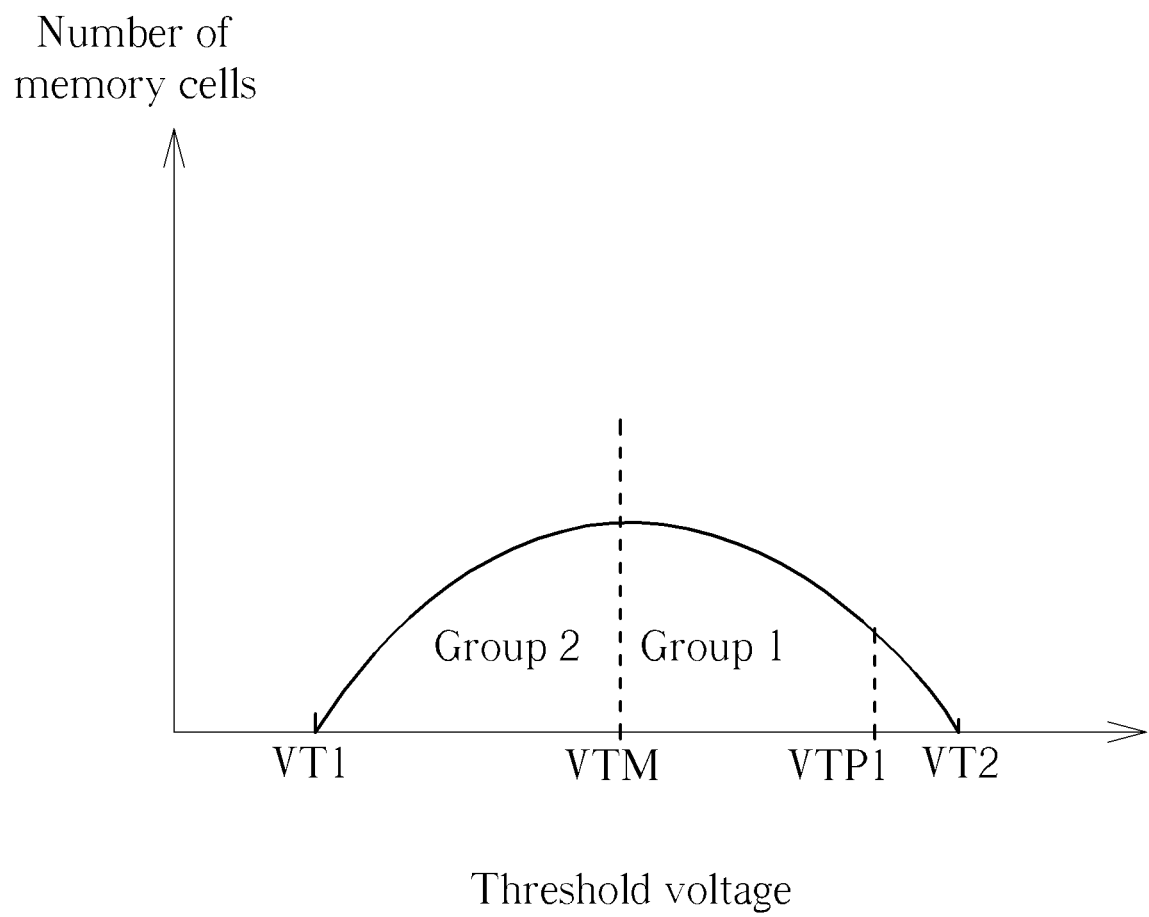
FIG. 2 shows a threshold voltage distribution of the memory cells after a program operation according to one embodiment of the present invention.

However, due to the uncontrollable variation caused during the manufacturing process, some of the memory cells may be easier to be programmed than others and require less times of program operations. FIG. 2 shows a threshold voltage distribution of the memory cells MC1 to MCN after a program operation according to one embodiment of the present invention. In FIG. 2, after the program operation is performed, the threshold voltages of the memory cells MC1 to MCN may be varied from VT1 to VT2.

For example, after the program operation, the memory cells of group 1 as marked in FIG. 2 may have their threshold voltages become greater than a middle voltage VTM. Also, the memory cells of group 2 as marked in FIG. 2 may have their threshold voltages remain lower than the middle voltage VTM. That is, the memory cells of group 1 can be identified as memory cells that are easier to be programmed since their threshold voltages can be raised more significantly by the program operation. Furthermore, in group 1, there are some memory cells having their threshold voltages greater than the first programming threshold voltage VTP1, which is the target threshold voltage for indicating the memory cell has been programmed or not. That is, these memory cells can be programmed successfully by only one program operation. Contrarily, the memory cells of group 2 can be identified as memory cells that are more difficult to be programmed since the changes of their threshold voltages are relatively smaller.

To program those memory cells that are more difficult to be programmed with better efficiency, the memory system 100 may apply a higher cross voltage between the control terminal and the first terminal of the storage element FT.

Figure 3:
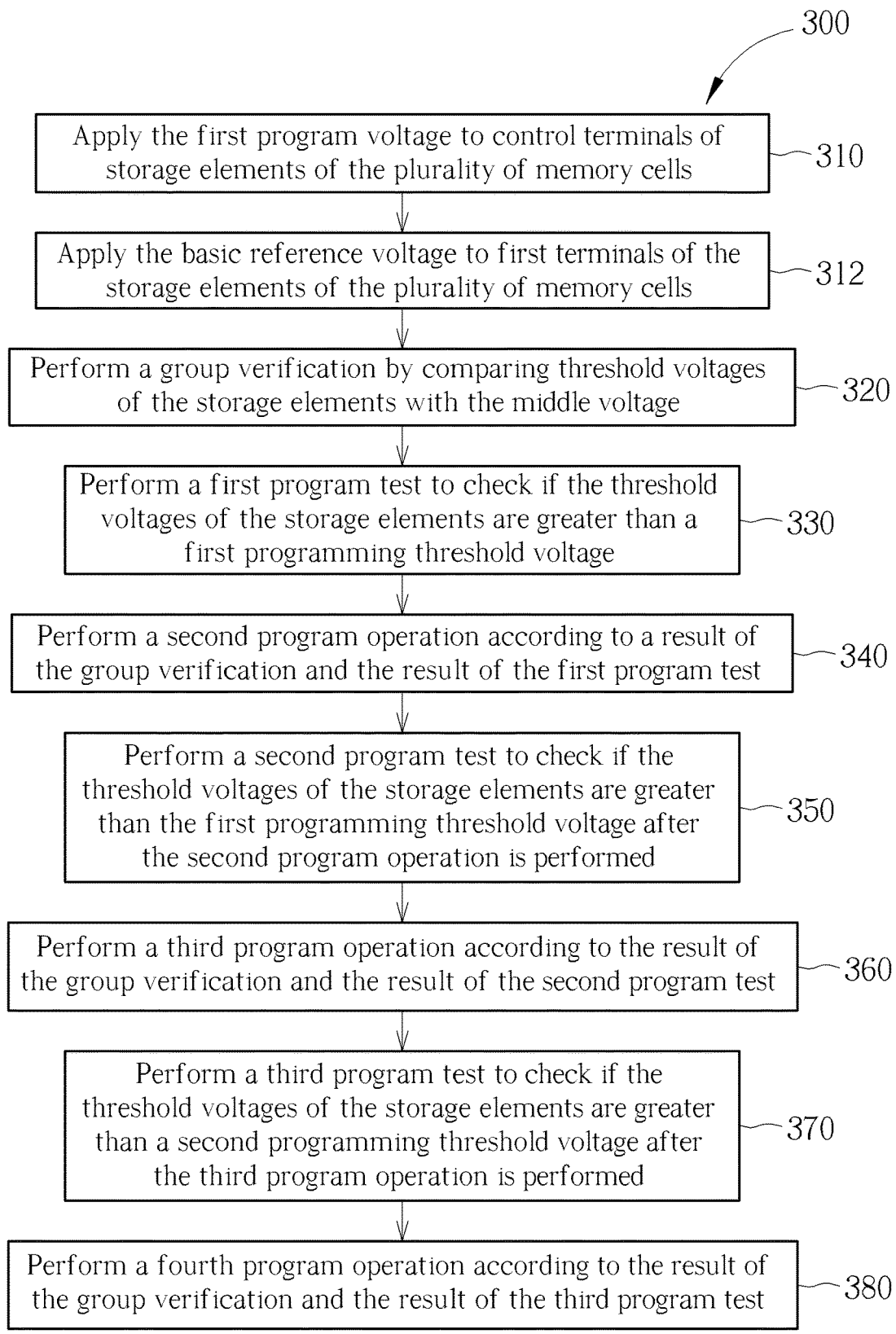
FIG. 3 shows a flowchart of a method for programming the memory system in FIG. 1 according to one embodiment of the present invention.
Figure 4:
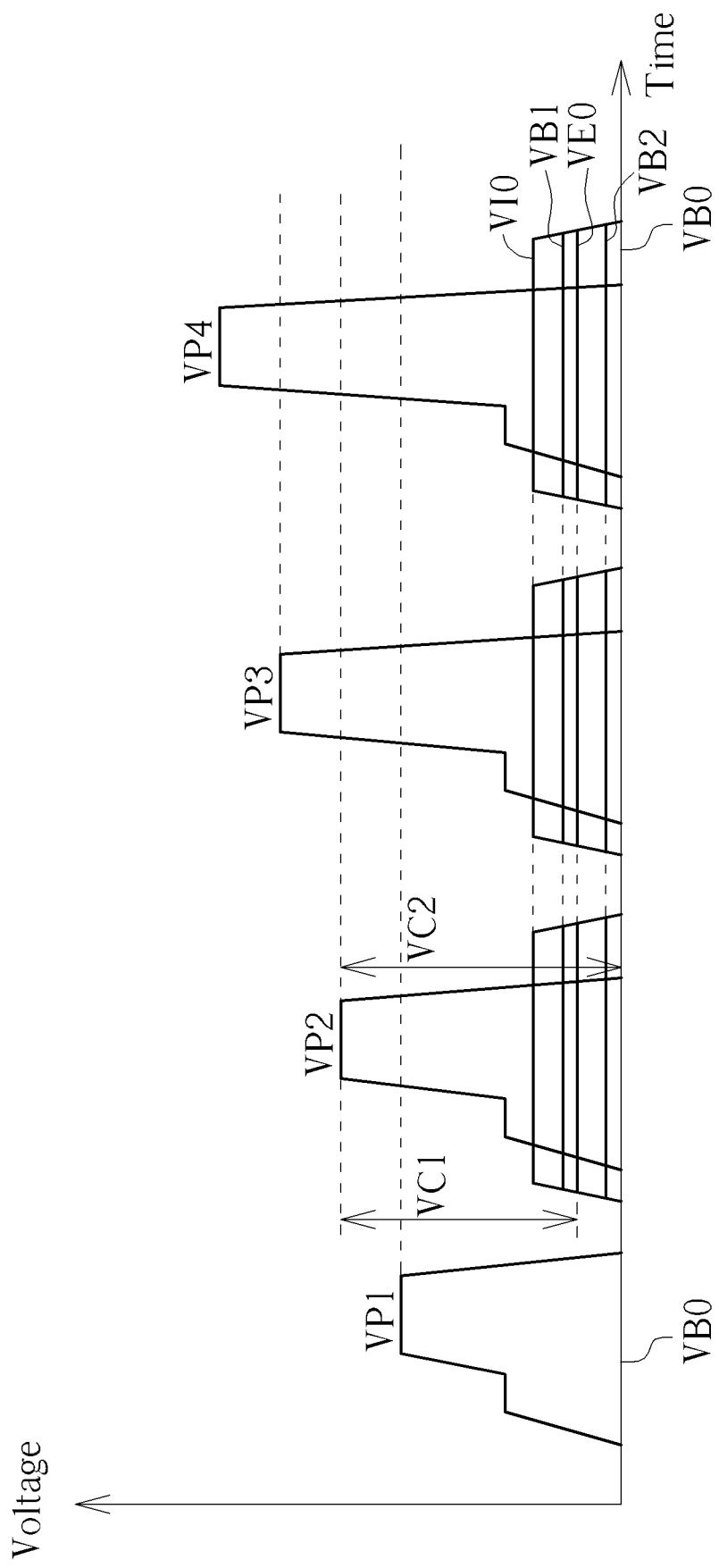
FIG. 4 shows the voltages used in the program operations of the method in FIG. 3.

FIG. 3 shows a flow chart of a method 300 for programming the memory system 100 according to one embodiment of the present invention. FIG. 4 shows the voltages used in the program operations of the method 300. The method 300 includes steps S310 to S390, but is not limited to the order shown in FIG. 3.

S310: applying the first program voltage VP1 to control terminals of storage elements FT of the plurality of memory cells MC1 to MCN;

S312: applying the basic reference voltage VB0 to first terminals of the storage elements FT of the plurality of memory cells MC1 to MCN;

S320: performing a group verification by comparing threshold voltages of the storage elements FT with the middle voltage VTM;

S330: performing a first program test to check if the threshold voltages of the storage elements FT are greater than a first programming threshold voltage VTP1;

S340: performing a second program operation according to a result of the group verification and the result of the first program test;

S350: performing a second program test to check if the threshold voltages of the storage elements FT are greater than the first programming threshold voltage VTP1 after the second program operation is performed;

S360: performing a third program operation according to the result of the group verification and the result of the second program test;

S370: performing a third program test to check if the threshold voltages of the storage elements FT are greater than a second programming threshold voltage after the third program operation is performed;

S380: performing a fourth program operation according to the result of the group verification and the result of the third program test.

In some embodiments, steps S310 and S312 can be performed during the first program operation of the plurality of memory cells MC1 to MCN to inject electrons to the gate structures of the storage elements FT in memory cells MC1 to MCN and raise the threshold voltages of the storage elements FT in memory cells MC1 to MCN to be programmed.

For example, in FIG. 4, by applying the first program voltage VP1 to the control terminals of the storage elements FT of the memory cells MC1 to MCN and applying the basic reference voltage VB0 to the first terminals of the storage elements FT of the memory cells MC1 to MCN, the memory cells MC1 to MCN can be programmed with steps S310 and S312.

After the first program operation, the memory system 100 can perform the group verification to determine which memory cells are easier to be programmed and which memory cells are more difficult to be programmed. In step S320, the group verification can be performed by comparing the threshold voltages of the storage elements FT with the middle voltage VTM.

Also, to check if the memory cells have been programmed successfully, the first program test can be performed in step S330 to check if the threshold voltages of the storage elements FT are greater than the first programming threshold voltage VTP1. The first programming threshold voltage VTP1 can be the target threshold voltage for indicating the memory cell has been programmed to have a first state of data.

For example, but not limited to, the memory cells MC1 to MCN may be able to store four different states of data, represented as "11", "10", "01", and "00". In this case, if the threshold voltage of the memory cell MC1 is smaller than the first programming threshold voltage VTP1, then the memory cell MC1 may be deemed as not being programmed, and the state of data stored in the memory cell MC1 may be represented as "11". However, if the threshold voltage of the memory cell MC1 is greater than the first programming threshold voltage VTP1, then the memory cell MC1 may be deemed as being programmed, and the state of data stored in the memory cell MC1 may be represented as "10". Also, if the memory cell MC1 is kept being programmed to have its threshold voltage greater than a second programming threshold voltage, which is greater than the first programming threshold voltage VTP1, then the memory cell MC1 will be deemed as being programmed with the state of data representing "01". Similarly, if the memory cell MC1 is kept being programmed to have its threshold voltage greater than a third programming threshold voltage, which is greater than the second programming threshold voltage, then the memory cell MC1 will be deemed as being programmed with the state of data representing "00". However, in some other embodiments, the memory cells MC1 to MCN may be able to store even more states of data, and the state of data may be represented by threshold voltages with different orders according to the application need.

Furthermore, in some embodiments, since the middle voltage VTM is used to verify the programming tendency of the memory cells MC1 to MCN, the middle voltage VTM can be smaller than the first programming threshold voltage VTP1. For example, in the case that the threshold voltages of the memory cells MC1 to MCN have a rather symmetrical distribution as shown in FIG. 2, the middle voltage VTM can be the center value of the threshold voltages between VT1 and VT2.

After the group verification and the first program test, the second program operation can be performed according to the result of the group verification and the result of the first program test. That is, the memory system 100 can program the memory cells MC1 to MCN with different cross voltages according to their programming tendency in step S340.

For example, if the threshold voltage of the memory cell MC1 is determined to be greater than the middle voltage VTM during the group verification but is determined to be smaller than the first programming threshold voltage VTP1 during the first program test, it may imply that the memory cell MC1 belongs to group 1, meaning that the memory cell MC1 is easier to be programed, and the memory cell MC1 has not been programmed successfully yet. If the threshold voltage of the memory cell MC2 is determined to be smaller than the middle voltage VTM during the group verification, it may imply that the memory cell MC2 belongs to group 2, meaning that the memory cell MC2 is more difficult to be programed, and the memory cell MC2 has not been programmed successfully yet.

In this case, the memory system 100 may apply a first cross voltage between the control terminal and the first terminal of the storage element of the memory cell MC1, and apply a second cross voltage between a control terminal and a first terminal of a storage element of the memory cell MC2. Since the memory cell MC2 is more difficult to be programmed, the second cross voltage can be greater than the first cross voltage. That is, during the second program operation, the memory cell MC2 can be programmed with a higher cross voltage so the threshold voltage of the memory cell MC2 can be changed faster and more significantly.

In FIG. 4, the first cross voltage VC1 between the control terminal and the first terminal of the storage element FT of the memory cell MC1 can be provided by applying a second program voltage VP2 to the control terminal of the storage element FT of the memory cell MC1 with the word line driver 120 and applying an enhanced reference voltage VE0 to the first terminal of the storage element FT of the memory cell MC1 with the voltage controller 1101. In the present embodiment, the second program voltage VP2 can be greater than the first program voltage VP1 to follow the principles of the incremental step pulse programming and improve the program efficiency.

Also, the second cross voltage VC2 between the control terminal and the first terminal of the storage element FT of the memory cell MC1 can be provided by applying the second program voltage VP2 to the control terminal of the storage element FT of the memory cell MC2 with the word line driver 120 and applying the basic reference voltage VB0 to the first terminal of the storage element FT of the memory cell MC2 with the voltage controller 1102. Since the control terminals of storage elements FT of the memory cells MC1 and MC2 will receive the same second program voltage VP2 while the enhanced reference voltage VE0 can be greater than the basic reference voltage VB0, the second cross voltage VC2 would be greater than the first cross voltage VC1.

In some embodiments, if a memory cell has been programmed successfully during the first program operation with steps S310 and S312, the programmed memory cell can be inhibited during the second program operation in step S340. For example, when the threshold voltage of the memory cell MC3 is determined to be greater than the first programming threshold voltage VTP1 during the first program test, it may imply that the memory cell MC3 has been programmed successfully at the current level. In this case, during the second program operation, the memory system 100 can apply the second program voltage VP2 to the control terminal of the storage element FT of the memory cell MC3 with the word line driver 120, and apply an inhibit reference voltage VI0 to the first terminal of the storage element FT of the memory cell MC3 with the voltage controller 1103. In this case, the inhibit reference voltage VI0 can be greater than the enhanced reference voltage VE0, so the third cross voltage VC3 between the control terminal and the first terminal of the storage element FT of the memory cell MC3 would be rather small. Therefore, no electrons will be injected to the storage element FT of the memory cell MC3 during the second program operation, and the memory cell MC3 can be inhibited in step S340. In some embodiments, the similar approach can be used to inhibit those memory cells that are not meant to be programmed during the first program operation and the following program operations.

Also, in some embodiments of the present invention, the first program test can further determine if the memory cell is almost programmed successfully, and the memory cell that is determined to be almost programmed successfully can be programmed with a relative smaller cross voltage during the second program operation, preventing the memory cell from being over programmed and helping to centralize the threshold voltages distribution of the memory cells.

For example, if the threshold voltage of the memory cell MC4 is determined to be greater than the middle voltage VTM during the group verification and is determined to be slightly smaller than the first programming threshold voltage VTP1 during the first program test, then memory cell MC4 maybe determined as almost being programmed successfully. In this case, the memory system 100 can, during the second program operation, apply the second program voltage VP2 to the control terminal of the storage element FT of the memory cell MC4 with the word line driver 120, and apply the first intermediate reference voltage VB1 to the first terminal of the storage element FT of the memory cell MC4 with the voltage controller 1104. Since the first intermediate reference voltage VB1 can be greater than the enhanced reference voltage VE0 as shown in FIG. 4, the memory cell MC4 can be programmed with a smaller cross voltage during the second program operation in step S340. However, since the first intermediate reference voltage VB1 can be smaller than the inhibit reference voltage VI0, electrons can still be injected to the storage element FT of the memory cell MC4 without being inhibited.

Similarly, if the threshold voltage of the memory cell MC5 is determined to be smaller than the middle voltage VTM during the group verification and is determined to be slightly smaller than the first programming threshold voltage VTP1 during the first program test, then the memory system 100 can, during the second program operation, apply the second program voltage VP2 to the control terminal of the storage element FT of the memory cell MC5 with the word line driver 120, and apply the second intermediate reference voltage VB2 to the first terminal of the storage element FT of the memory cell MC5 with the voltage controller 1105. In this case, since the second intermediate reference voltage VB2 can be greater than the basic reference voltage VB0 and can be smaller than the enhanced reference voltage VE0, the memory cell MC5 can be programmed with a smaller cross voltage during the second program operation in step S340. Furthermore, since the memory cell MC5 belongs to group 2 and is determined to be more difficult to be programmed than the memory cell MC4 according to the group verification, the second intermediate reference voltage VB2 can be smaller than the first intermediate reference voltage VB1, so the memory cell MC5 can be programmed with a cross voltage greater than the memory cell MC4.

In the aforementioned embodiments, to apply different cross voltages to program memory cells in different conditions during the second program operation, memory cells MC1 to MC5 may receive the same program voltage from their control terminals of the storage elements FT, and may receive different reference voltages from their first terminals of the storage elements FT. In this case, the memory cells MC1 to MCN can be coupled to the same word line WL, and can be operated simultaneously as a page. In some embodiments as shown in FIG. 1, the memory system 100 can further include a word line driver 120 coupled to the word line WL for applying program voltages to the control terminals of the storage elements FT through the word line WL.

Another reason to provide different voltages through the bit lines to the first terminals of the storage elements FT instead of through the word lines to the control terminals of the storage elements FT is that the program voltages VP1 and VP2 are usually high voltages generated by charge pumps, and it may require more charge pump circuits to provide different levels of program voltages. In FIG. 1, the memory system 100 can further include N voltage controllers 1101 to 110N for providing the reference voltages to the first terminals of the storage elements FT of the memory cells MC1 to MCN respectively. The voltage controllers 1101 to 110N can provide different reference voltages, including the basic reference voltage VB0, the enhanced reference voltage VE0, the inhibit reference voltage VI0, the first intermediate reference voltage VB1 and the second intermediate reference voltage VB2, according to the conditions of the memory cells MC1 to MCN. However, in some other embodiments of the present invention, the cross voltages may be provided by other different structures according to the system requirement.

Furthermore, after the second program operation in step S340, the second program test can be performed to check if the threshold voltages of the storage elements FT are greater than the first programming threshold voltage VTP1 in step S350. Thus, according to the result of the group verification and the result of the second program test, the third program operation would be performed in step S360.

During the third program operation, the result of the group verification generated in step S320 will still be used to determine the cross voltages for program operation. For example, if the threshold voltage of the memory cell MC6 is determined to be greater than the middle voltage VTM during the group verification and is determined to be smaller than the first programming threshold voltage VTP1 during the second program test, and the threshold voltage of the memory cell MC7 is determined to be smaller than the middle voltage VTM during the group verification and is determined to be smaller than the first programming threshold voltage VTP1 during the second program test, then the memory system 100 can apply a third cross voltage between the control terminal and the first terminal of the storage element FT of the memory cell MC6 smaller than a fourth cross voltage applied between the control terminal and the first terminal of the storage element FT of the memory cell MC7. That is, the memory cell MC7 will be programmed with a greater cross voltage than the memory cell MC6, so the memory cell MC7 may raise its threshold voltage faster and catch up with the progress of the memory cell MC6.

In some embodiments, the third cross voltage can be applied by applying a third program voltage VP3 to the control terminal of the storage element FT of the memory cell MC6, and the enhanced reference voltage VE0 to the first terminal of the storage element FT of the memory cell MC6. Also, the third program voltage VP3 can be greater than the second program voltage VP2 to achieve the incremental step pulse programming.

Similarly, the fourth cross voltage can be applied by applying the third program voltage VP3 to the control terminal of the storage element FT of the memory cell MC7, and the basic reference voltage VB0 to the first terminal of the storage element FT of the memory cell MC7.

Furthermore, memory cells that are determined to be programmed successfully during the second program test in step S350 can be inhibited by applying the inhibit reference voltage VI0 to the first terminals of the storage elements FT.

In some embodiments, by programming memory cells that are more difficult to be programmed with a higher cross voltage and programming memory cells that are easier to be programmed with a lower cross voltage, the distribution of threshold voltages of the memory cells MC1 to MCN can be more centralized the program efficiency can be improved. Thus, after the third program operation in step S360, some of the memory cells that are meant to be programmed with the data of "01" (that is, to be programmed to have a threshold voltage greater than the second programming threshold voltage but smaller than the third programming threshold voltage) may already be programmed to have threshold voltages greater than the second programming threshold voltage, that is, the next target programming threshold voltage. In this case, the third program test can be performed to check if the threshold voltages of the storage elements FT are greater than the second programming threshold voltage for those memory cells that are meant to be programmed with data of "01" in step S370 after the third program operation is performed. Also, the fourth program operation will be performed according to the result of the group verification and the result of the third program test in step S380.

For example, memory cells MC8 and MC9 are meant to be programmed with the data of "01". If the threshold voltage of the memory cell MC8 is determined to be greater than the middle voltage VTM during the group verification and is determined to be smaller than the second programming threshold voltage during the third program test, and the threshold voltage of the memory cell MC9 is determined to be smaller than the middle voltage VTM during the group verification and is determined to be smaller than the second programming threshold voltage during the third program test, then the memory system 100 can apply a fifth cross voltage between the control terminal and the first terminal of the storage element FT of the memory cell MC8 smaller than a sixth cross voltage applied between the control terminal and the first terminal of the storage element of the memory cell MC9.

That is, the memory cell MC9 will be programmed with a greater cross voltage than the memory cell MC8, so the memory cell MC9 may raise its threshold voltage faster and catch up with the progress of the memory cell MC8.

In some embodiments, the fifth cross voltage can be applied by applying a fourth program voltage VP4 to the control terminal of the storage element FT of the memory cell MC8 and applying the enhanced reference voltage VE0 to the first terminal of the storage element FT of the memory cell MC8. Also, the fourth program voltage VP4 can be greater than the third program voltage VP3 to achieve the incremental step pulse programming.

Similarly, the sixth cross voltage can be applied by applying the fourth program voltage VP4 to the control terminal of the storage element FT of the memory cell MC9 and applying the basic reference voltage VB0 to the first terminal of the storage element FT of the memory cell MC9.

In prior art, without applying higher cross voltages for memory cells that are more difficult to be programmed, memory cells MC1 to MCN may require more times of program operations to complete the program process for storing the desired states of data.

Figure 5:
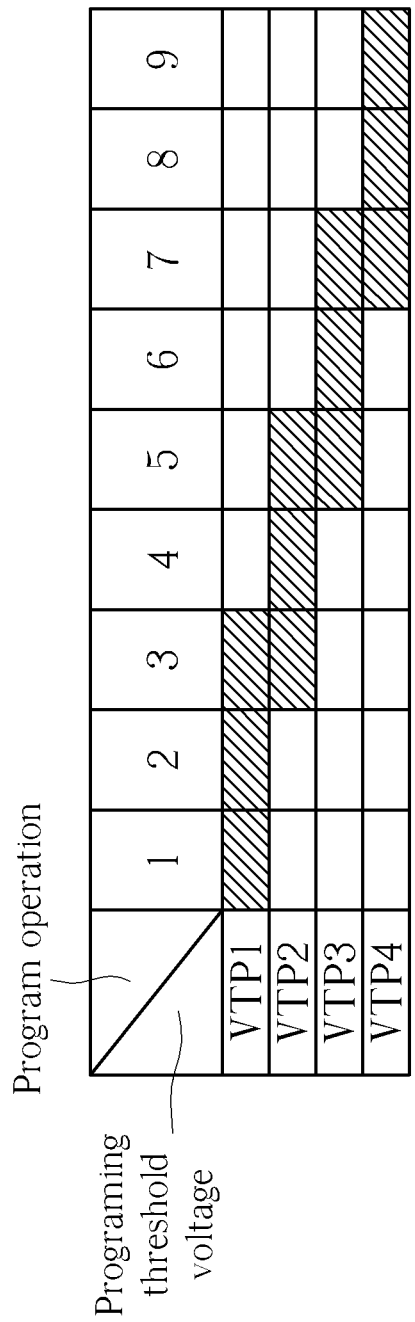
FIG. 5 shows a table of the programming threshold voltages to be tested after different program operations according to one embodiment of the present invention.
Figure 6:
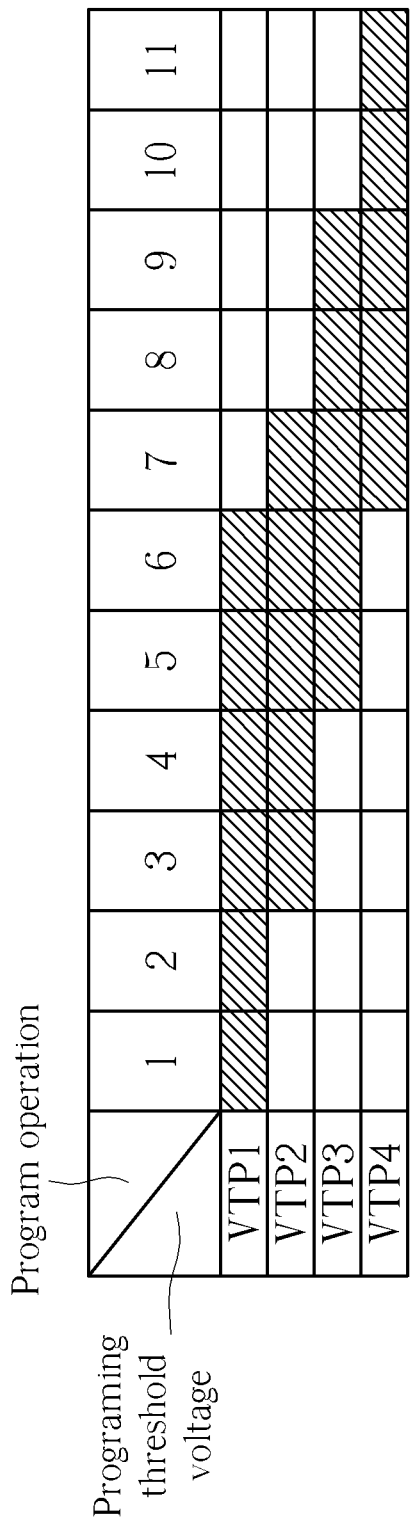
FIG. 6 shows a table of the programming threshold voltages to be tested after different program operations according prior art.

FIG. 5 shows a table of the programming threshold voltages VTP1 to VTP4 to be tested after different program operations according to one embodiment of the present invention and FIG. 6 shows a table of the programming threshold voltages VTP1 to VTP4 to be tested after different program operations according prior art.

In FIG. 5, after the third program operation, almost all of the memory cells MC1 to MCN can be programmed to have threshold voltages greater than the first programming threshold voltage VTP1, and thus the second programming threshold voltage VTP2 can be tested after the third program operation. However, in prior art without applying different cross voltages according to the result of the group verification, it may require more than five program operations before the threshold voltages of all memory cells become greater than the first programming threshold voltage VTP1. Therefore, to complete the program process for storing the four different states of data, the memory system 100 operated with the method 300 may need 9 program operations while the prior art would require 11 program operations.

Furthermore, since the program operations can be performed according to the results of both the program test and the group verification, the threshold voltages of the memory cells MC1 to MCN can be more centralized than the prior art. That is, since the memory cells that are more difficult to be programmed will be programmed with higher cross voltages, these memory cells can be programmed faster. Therefore, the number of program tests required by the memory system 100 will be smaller than that of prior art. For example, in FIG. 5, after each program operation, there are no more than two program tests.

However, if the memory cells are programmed with the same cross voltages without classification, the threshold voltages of the memory cells will have a wider distribution, which requires more program tests for each program operation. For example, after the fifth program operation, there are three different program tests that have to be performed in FIG. 6. As a result, the total number of program tests is 12 in FIG. 5 while the total number of program tests is 21 in FIG. 6. Since more program operations and more program tests will consume more power, with the method 300, the memory system 100 can both improve the efficiency of the program process and reduce power consumption.

In summary, the memory system and the method for programming the memory system provided by the embodiments of the present invention can perform the program operations according to the results of both the program test and the group verification; therefore, memory cells that are more difficult to be programmed can be programmed with higher cross voltages to increase the program process, and the threshold voltages of the memory cells MC1 to MCN can be centralized. Consequently, the efficiency of the program process can be improved, and the power required to complete the program process can be significantly reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for programming a memory system, the memory system comprising a plurality of memory cells, each comprising a storage element having a first terminal and a control terminal, the method comprising:
   during a first program operation of the plurality of memory cells:
      applying a first program voltage to control terminals of storage elements of the plurality of memory cells; and
      applying a basic reference voltage to first terminals of the storage elements of the plurality of memory cells;
   performing a group verification by comparing threshold voltages of the storage elements with a middle voltage;
   performing a first program test to check if the threshold voltages of the storage elements are greater than a first programming threshold voltage; and
   performing a second program operation according to a result of the group verification and a result of the first program test;
   wherein:
   the middle voltage is smaller than the first programming threshold voltage.

2. The method of claim 1, wherein the middle voltage is a central value of the threshold voltages of the storage elements after the first program operation.

3. The method of claim 1, wherein:
   when a first memory cell and a second memory cell of the plurality of memory cells are determined to be in different groups during the group verification, performing the second program operation according to the result of the group verification and the result of the first program test comprises:
      applying a same program voltage to a control terminal of a storage element of the first memory cell and a control terminal of a storage element of the second memory cell; and
      applying different reference voltages to a first terminal of the storage element of the first memory cell and a first terminal of the storage element of the second memory cell.

4. The method of claim 1, wherein:
   when a threshold voltage of a first memory cell is determined to be greater than the middle voltage during the group verification but is determined to be smaller than the first programming threshold voltage during the first program test, and a threshold voltage of a second memory cell is determined to be smaller than the middle voltage during the group verification, performing the second program operation according to the result of the group verification and the result of the first program test comprises:
      applying a first cross voltage between a control terminal and a first terminal of a storage element of the first memory cell; and
      applying a second cross voltage between a control terminal and a first terminal of a storage element of the second memory cell; and
   the second cross voltage is greater than the first cross voltage.

5. The method of claim 4, wherein:
applying the first cross voltage between the control terminal and the first terminal of the storage element of the first memory cell comprises:
- applying a second program voltage to the control terminal of the storage element of the first memory cell; and
- applying an enhanced reference voltage to the first terminal of the storage element of the first memory cell;

the second program voltage is greater than the first program voltage; and
the enhanced reference voltage is greater than the basic reference voltage.

6. The method of claim 5, wherein:
applying the second cross voltage between the control terminal and the first terminal of the storage element of the second memory cell comprises:
- applying the second program voltage to the control terminal of the storage element of the second memory cell; and
- applying the basic reference voltage to the first terminal of the storage element of the second memory cell.

7. The method of claim 5, wherein:
when a threshold voltage of a third memory cell is determined to be greater than the first programming threshold voltage during the first program test, performing the second program operation according to the result of the group verification and the result of the first program test further comprises:
- applying the second program voltage to a control terminal of a storage element of the third memory cell; and
- applying an inhibit reference voltage to a first terminal of the storage element of the third memory cell; and the inhibit reference voltage is greater than the enhanced reference voltage.

8. The method of claim 7, wherein:
when a threshold voltage of a fourth memory cell is determined to be greater than the middle voltage during the group verification and is determined to be slightly smaller than the first programming threshold voltage during the first program test, performing the second program operation according the result of the group verification and the result of the first program test comprises:
- applying the second program voltage to a control terminal of a storage element of the fourth memory cell; and
- applying a first intermediate reference voltage to a first terminal of the storage element of the fourth memory cell; and the first intermediate reference voltage is greater than the enhanced reference voltage and is smaller than the inhibit reference voltage.

9. The method of claim 5, wherein:
when a threshold voltage of a fifth memory cell is determined to be smaller than the middle voltage during the group verification and is determined to be slightly smaller than the first programming threshold voltage during the first program test, performing the second program operation according to the result of the group verification and the result of the first program test further comprises:
- applying the second program voltage to a control terminal of a storage element of the fifth memory cell; and
- applying a second intermediate reference voltage to a first terminal of the storage element of the fifth memory cell; and the second intermediate reference voltage is greater than the basic reference voltage and is smaller than the enhanced reference voltage.

10. The method of claim 1, further comprising:
performing a second program test to check if the threshold voltages of the storage elements are greater than the first programming threshold voltage after the second program operation is performed; and
performing a third program operation according to the result of the group verification and a result of the second program test.

11. The method of claim 10, wherein:
when a threshold voltage of a sixth memory cell is determined to be greater than the middle voltage during the group verification and is determined to be smaller than the first programming threshold voltage during the second program test, and a threshold voltage of a seventh memory cell is determined to be smaller than the middle voltage during the group verification and is determined to be smaller than the first programming threshold voltage during the second program test, performing the third program operation according to the result of the group verification and the result of the second program test comprises:
- applying a third cross voltage between a control terminal and a first terminal of a storage element of the sixth memory cell; and
- applying a fourth cross voltage between a control terminal and a first terminal of a storage element of the seventh memory cell; and the fourth cross voltage is greater than the third cross voltage.

12. The method of claim 11, wherein:
applying the third cross voltage between the control terminal and the first terminal of the storage element of the sixth memory cell comprises:
- applying a third program voltage to the control terminal of the storage element of the sixth memory cell; and
- applying the enhanced reference voltage to the first terminal of the storage element of the sixth memory cell; and the third program voltage is greater than the second program voltage.

13. The method of claim 12, wherein:
applying the fourth cross voltage between the control terminal and the first terminal of the storage element of the seventh memory cell comprises:
- applying the third program voltage to the control terminal of the storage element of the seventh memory cell; and
- applying the basic reference voltage to the first terminal of the storage element of the seventh memory cell.

14. The method of claim 10, further comprising:
performing a third program test to check if the threshold voltages of the storage elements are greater than a second programming threshold voltage after the third program operation is performed; and
performing a fourth program operation according to the result of the group verification and a result of the third program test.

15. The method of claim 10, wherein:
when a threshold voltage of an eighth memory cell is determined to be greater than the middle voltage during the group verification and is determined to be smaller than the second programming threshold voltage during the third program test, and a threshold voltage of a ninth memory cell is determined to be smaller than the middle voltage during the group verification and is determined to be smaller than the second programming threshold voltage during the third program test, performing the fourth program operation according to the result of the group verification and the result of the third program test comprises:
applying a fifth cross voltage between a control terminal and a first terminal of a storage element of the eighth memory cell; and
applying a sixth cross voltage between a control terminal and a first terminal of a storage element of the ninth memory cell; and
the sixth cross voltage is greater than the fifth cross voltage.

16. The method of claim 15, wherein:
applying the fifth cross voltage between the control terminal and the first terminal of the storage element of the eighth memory cell comprises:
applying a fourth program voltage to the control terminal of the storage element of the eighth memory cell; and
applying the enhanced reference voltage to the first terminal of the storage element of the eighth memory cell; and
the fourth program voltage is greater than the third program voltage.

17. The method of claim 16, wherein:
applying the sixth cross voltage between the control terminal and the first terminal of the storage element of the ninth memory cell comprises:
applying the fourth program voltage to the control terminal of the storage element of the ninth memory cell; and
applying the basic reference voltage to the first terminal of the storage element of the ninth memory cell.

18. A memory system comprising:
a plurality of memory cells, each comprising a storage element having a first terminal, and a control terminal coupled to a word line;
a word line driver coupled to the word line; and
a plurality of voltage controllers, each coupled to a first terminal of a storage element of a corresponding memory cell of the plurality of memory cells;
wherein:
the memory system is configured to perform a first program operation of the plurality of memory cells, and during the first program operation:
the plurality of voltage controllers are configured to apply a first program voltage to control terminals of storage elements of the plurality of memory cells; and
the word line driver is configured to transmit a basic reference voltage to first terminals of the storage elements of the plurality of memory cells;
the memory system is further configured to perform a group verification by comparing threshold voltages of the storage elements with a middle voltage after the first program operation;
the memory system is further configured to perform a first program test to check if the threshold voltages of the storage elements are greater than a first programming threshold voltage after the first program operation;
the memory system is further configured to perform a second program operation according to a result of the group verification and a result of the first program test; and
the middle voltage is smaller than the first programming threshold voltage.

19. The memory system of claim 18, wherein the middle voltage is a central value of the threshold voltages of the storage elements after the first program operation.

20. The memory system of claim 18, wherein:
when a first memory cell and a second memory cell of the plurality of memory cells are determined to be in different groups during the group verification, the memory system performs the second program operation by making:
the word line driver apply a same program voltage to a control terminal of a storage element of the first memory cell and a control terminal of a storage element of the second memory cell; and
a first voltage controller and a second voltage controller apply two different reference voltages to a first terminal of the storage element of the first memory cell and a first terminal of the storage element of the second memory cell respectively.

21. The memory system of claim 18, wherein:
when a threshold voltage of a first memory cell is determined to be greater than the middle voltage during the group verification but is determined to be smaller than the first programming threshold voltage during the first program test, and a threshold voltage of a second memory cell is determined to be smaller than the middle voltage during the group verification, the memory system performs the second program operation by making:
the word line driver apply a second program voltage to the control terminal of the storage element of the first memory cell and the control terminal of the storage element of the second memory cell;
a first voltage controller apply an enhanced reference voltage to the first terminal of the storage element of the first memory cell; and
a second voltage controller apply an the basic reference voltage to the first terminal of the storage element of the second memory cell;
the second program voltage is greater than the first program voltage; and
the enhanced reference voltage is greater than the basic reference voltage.

22. The memory system of claim 21, wherein:
when a threshold voltage of a third memory cell is determined to be greater than the first programming threshold voltage during the first program test, the memory system performs the second program operation by making:
the word line driver apply the second program voltage to a control terminal of a storage element of the third memory cell; and
a third voltage controller apply an inhibit reference voltage to a first terminal of the storage element of the third memory cell; and
the inhibit reference voltage is greater than the enhanced reference voltage.

23. The memory system of claim 21, wherein:
when a threshold voltage of a fourth memory cell is determined to be greater than the middle voltage during the group verification and is determined to be slightly smaller than the first programming threshold voltage during the first program test, the memory system performs the second program operation by making:
- the word line driver apply the second program voltage to a control terminal of a storage element of the fourth memory cell; and
- a fourth voltage controller apply a first intermediate reference voltage to a first terminal of the storage element of the fourth memory cell; and the first intermediate reference voltage is greater than the enhanced reference voltage and is smaller than the inhibit reference voltage.

24. The memory system of claim 21, wherein:

when a threshold voltage of a fifth memory cell is determined to be smaller than the middle voltage during the group verification and is determined to be slightly smaller than the first programming threshold voltage during the first program test, the memory system performs the second program operation by making:
- the word line driver apply the second program voltage to a control terminal of a storage element of the fifth memory cell; and
- a fifth voltage controller apply a second intermediate reference voltage to a first terminal of the storage element of the fifth memory cell; and the second intermediate reference voltage is greater than the basic reference voltage and is smaller than the enhanced reference voltage.

* * * * *